United States Patent
Tamagaki et al.

(10) Patent No.: US 7,776,393 B2
(45) Date of Patent: Aug. 17, 2010

(54) METHODS OF PRODUCING AN ALUMINA FILM MAINLY IN ALPHA CRYSTAL STRUCTURE AND THE MULTILAYER FILM THEREOF

(75) Inventors: Hiroshi Tamagaki, Takasago (JP); Toshimitsu Kohara, Takasago (JP); Toshiki Sato, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 996 days.

(21) Appl. No.: 10/551,993

(22) PCT Filed: Mar. 22, 2004

(86) PCT No.: PCT/JP2004/003813

§ 371 (c)(1),
(2), (4) Date: Oct. 4, 2005

(87) PCT Pub. No.: WO2004/090191

PCT Pub. Date: Oct. 21, 2004

(65) Prior Publication Data

US 2006/0257562 A1 Nov. 16, 2006

(30) Foreign Application Priority Data

Apr. 4, 2003 (JP) ............................. 2003-102019

(51) Int. Cl.
*C23C 16/00* (2006.01)
*B05D 1/12* (2006.01)
*B05D 7/00* (2006.01)
*C23C 14/00* (2006.01)

(52) U.S. Cl. .................... 427/248.1; 427/180; 427/299; 427/600

(58) Field of Classification Search .................... None
See application file for complete search history.

(56) References Cited

U.S. PATENT DOCUMENTS 3,928,026 A * 12/1975 Hecht et al. ................. 428/615
4,341,834 A * 7/1982 Kikuchi et al. .............. 428/216
4,788,077 A * 11/1988 Kang ......................... 427/456

(Continued)

FOREIGN PATENT DOCUMENTS

DE 696 21 063 T2 2/2003

(Continued)

OTHER PUBLICATIONS

Ikeda, Thin Solid Films, V195 (1991), p. 99-110—Abstract.*

(Continued)

*Primary Examiner*—Bret Chen
*Assistant Examiner*—Joseph Miller, Jr.
(74) *Attorney, Agent, or Firm*—Oblon, Spivak, McClelland, Maier & Neustadt, L.L.P.

(57) ABSTRACT

Provided is a method of producing an alumina film mainly in alpha crystal structure superior in heat resistance, wherein the alumina film mainly in alpha crystal structure is formed on a substrate, independently of the kind of the substrate at relatively low temperature, by treating the substrate surface with a ceramic powder mainly having the crystal structure same as that of alumina in the alpha crystal structure, in forming the alumina film mainly in alpha crystal structure on the substrate (including the substrate having a film previously formed thereon).

18 Claims, 17 Drawing Sheets

U.S. PATENT DOCUMENTS

| | | | |
|---|---|---|---|
| 4,968,426 A * | 11/1990 | Hay | 210/490 |
| 5,389,194 A * | 2/1995 | Rostoker et al. | 134/1.3 |
| 5,683,761 A | 11/1997 | Bruce et al. | |
| 5,693,417 A | 12/1997 | Goedicke et al. | |
| 6,123,997 A * | 9/2000 | Schaeffer et al. | 427/383.7 |
| 6,156,383 A | 12/2000 | Ishii et al. | |
| 2003/0022012 A1 * | 1/2003 | Warnes et al. | 428/610 |
| 2005/0058850 A1 | 3/2005 | Kohara et al. | |
| 2005/0276990 A1 | 12/2005 | Kohara et al. | |

FOREIGN PATENT DOCUMENTS

| | | |
|---|---|---|
| EP | 0 727 510 B1 | 8/1996 |
| EP | 0 744 473 A1 | 11/1996 |
| EP | 0 780 484 A1 | 6/1997 |
| JP | 9-324278 | 12/1997 |
| JP | 10-140353 | 5/1998 |
| JP | 2001-342556 | 12/2001 |
| JP | 2001-345556 * | 12/2001 |
| JP | 2002-233848 | 8/2002 |
| JP | 2004-91920 | 3/2004 |

OTHER PUBLICATIONS

Ikeda, Thin Solid Films, 195 (1991), p. 99-110. Complete citation.*
Taira, Dec. 2001, JP2001-342556, English computer translation including abstract (replaces or supplemental to that previously submitted).*
U.S. Appl. No. 12/402,763, filed Mar. 12, 2009, Kohara et al.
U.S. Appl. No. 12/402,755, filed Mar. 12, 2009, Kohara et al.

* cited by examiner

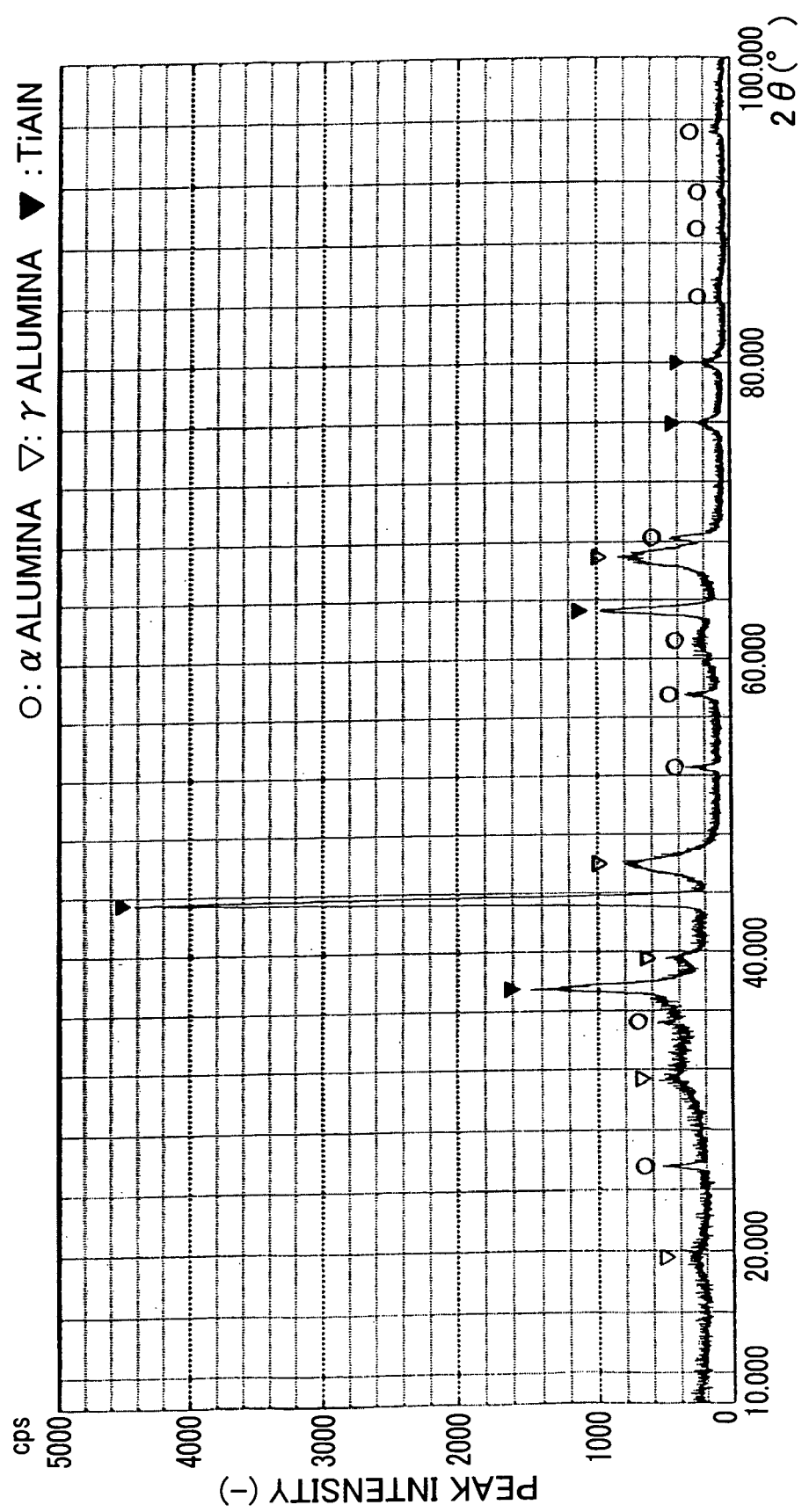

METHODS OF PRODUCING AN ALUMINA FILM MAINLY IN ALPHA CRYSTAL STRUCTURE AND THE MULTILAYER FILM THEREOF

FIELD OF THE INVENTION

The present invention relates to a method of producing an alumina film mainly in alpha crystal structure to be deposited on wear-resistant products such as cutting tool, sliding parts, and die and a method of producing a multilayer film-deposited product by forming an alumina film mainly in alpha crystal structure on the outmost layer of the product by the method above, and in particular, to a useful production method that allows production of an alumina film mainly in alpha crystal structure (hereinafter, referred to simply as "quasi-alpha-alumina film") under a low-temperature condition that does not impair the properties of the substrate, independent of the kind of the substrate such as the cutting tool or the sliding parts.

The alumina film obtained by the present invention can be applied to the various applications described above, but the invention will be described hereinafter, applying it mainly to cutting tool as a typical example.

BACKGROUND OF THE INVENTION

Generally, substrates, for example of high-speed steel and cemented carbide, having a hard film such as of titanium nitride or titanium aluminum nitride formed on the surface thereof by physical vapor deposition method (hereinafter, referred to as PVD method), chemical vapor deposition method (hereinafter, referred to as CVD method), or the like have been used as cutting tools and sliding parts, for which superior wear resistance and sliding property are demanded.

In particular, in case of application as a cutting tool that demands high wear and heat resistance (oxidation resistance at high temperature) from the hard film, titanium aluminum nitride (TiAlN) that is superior in both of these properties has been used widely as a coating material for applications such as cemented carbide tools, the edge of which becomes heated to high temperature during machining. The reason for such advantageous properties of TiAlN is that the TiAlN film is improved in heat resistance by the action of aluminum contained in the film and exhibits excellent wear and heat resistance consistently up to a high temperature of approximately 800° C. Various TiAlN's different in the compositions of Ti and Al have been used as the TiAlN films, but most of them have a composition in which they are is superior in both properties, that is, a Ti:Al atomic ratio in the range of 50:50 to 25:75.

Meanwhile, the edge of a cutting tool or the like is occasionally heated to a temperature of 1,000° C. or higher during machining. Under such circumstance, because the TiAlN film alone is not sufficiently effective as it is in ensuring heat resistance, it is often practiced to form an alumina layer additionally on a TiAlN film for ensuring heat resistance, as disclosed, for example, in U.S. Pat. No. 5,879,823.

Alumina has various crystal structures, depending on temperature, but all of the crystal structures are in the thermally metastable state. However, in the case of a cutting tool, the temperature of the edge fluctuates in a wide range from room temperature to 1,000° C. or higher during machining, which causes transformation in the crystal structure of alumina and consequently leads to problems such as the cracking and delamination of film. However, alumina in the alpha crystal structure that is formed by CVD at a higher substrate temperature of 1,000° C. or more, if once formed, retains its thermally stable structure, independently of the temperature thereafter. Thus, deposition of an alumina film in the alpha crystal structure is regarded as an effective means of providing heat resistance to cutting tools and others.

However as described above, it is necessary to heat the substrate to 1,000° C. or higher to form alumina in the alpha crystal structure, which restricts the kind of compatible substrates. It is because some substrates soften and lose its favorable properties as a substrate for wear-resistant products, depending on its kind, when exposed to a high temperature of 1,000° C. or higher. Even high heat-resistant substrates including cemented carbides also exhibit problems such as deformation, when exposed to such a high temperature. In addition, practical temperature range for use of the hard films such as TiAlN film that are formed on substrate as an wear-resisting film is generally, approximately 800° C. at the highest, and such films may degenerate and lead to deterioration in wear resistance when exposed to a high temperature of 1,000° C. or higher For overcoming such problems, U.S. Pat. No. 5,310,607 reported that it was possible to obtain a $(Al,Cr)_2O_3$ composite crystal having a hardness as high as that of the alumina described above in a lower temperature range of 500° C. or lower. However if the work material contains iron as the principal component, Cr existing on the surface of the composite crystal film often reacts with iron in the work material chemically during machining, leading to enhanced consumption of the film and reduction of the lifetime.

Separately, O. Zywitzki, G. Hoetzsch, et al. reported in "Surf. Coat. Technol." (86-87, 1996, p. 640-647) that it was possible to form an aluminum oxide film in the alpha crystal structure at 750° C. by performing reactive sputtering by using a pulse power supply having a high output (11 to 17 kW). However, it is inevitable to expand the capacity of pulse power supply for obtaining aluminum oxide in the alpha crystal structure by this method.

As a method overcoming such problems, Japanese unexamined patent publication No. 2002-53946 discloses a method of forming an oxide film having a film thickness of at least 0.005 μm in the corundum structure (alpha crystal structure) having a lattice parameter of 4.779 Å or more and 5.000 Å or less as an underlayer and forming an alumina film in the alpha crystal structure on the underlayer. The patent application above shows that the component for the oxide film is preferably $Cr_2O_3$, $(Fe,Cr)_2O_3$ or $(Al,Cr)_2O_3$; more preferably $(Fe_x,Cr_{(1-x)})_2O_3$ (wherein, $0 \leq x \leq 0.54$) when it is $(Fe,Cr)_2O_3$ and $(Al_y,Cr_{(1-y)})_2O_3$ (wherein, $0 \leq y \leq 0.90$) when it is $(Al, Cr)_2O_3$.

It also indicates that it is effective to form a film of a composite nitride containing Al and one or more elements selected from the group consisting of Ti, Cr, and V as a hard film, a film of $(Al_z,Cr_{(1-z)})N$ (wherein, $0 \leq z \leq 0.90$) as an intermediate layer thereon which forms an oxide film having the corundum structure (alpha crystal structure) by further oxidizing the film above, and then form alumina in the alpha crystal structure on the oxide film.

The inventors proposed various methods for forming an alumina film mainly in alpha crystal structure on a hard film (for example, Japanese Patent Application No. 2002-233848).

However, when the methods proposed by the inventors are applied to various kinds of substrates other than hard films, it was not possible to obtain a quasi-alpha-alumina film, depending on the kind of substrate. In addition when an alumina film is formed at a temperature of about 700° C. in the relatively lower temperature range on the hard film above, which usually allows generation of the quasi-alpha-alumina film, the ratio of the γ to alpha crystal structure increased in the alumina film obtained. Experimental results confirming the description above will be described below in detail.

First, the following three substrates (1) to (3) were prepared and the following experiments A and B were performed.

(1) Si wafer (2) Cemented carbide substrate (12.7 mm×12.7 mm×5 mm) polished to mirror surface (Ra: approximately 0.02 μm) having a 2- to 3-μm TiAlN ($Ti_{0.55}Al_{0.45}N$) hard film formed thereon by the arc ion-plating method (hereinafter, referred to as AIP method) as a hard film (3) cemented carbide substrate treated similarly to the substrate (2) having a 2- to 3-μm CrN film formed thereon by the AIP method as a hard film.

<Experiment A>

Each substrate was first oxidized, and then, an alumina film was formed thereon. The substrate was oxidized and the alumina film was formed in the vacuum deposition device shown in FIG. 1 (AIP-S40 hybrid coater machine, manufactured by Kobe Steel) equipped with an AIP cathode (indicated by No. 7 in FIG. 1 below), a magnetron-sputtering cathode, a heater heating mechanism, a substrate-rotating mechanism, and others.

The substrate was oxidized as follows: A sample (substrate) 2 was connected to each planetary revolving jig 4 on the revolving table 3 in the device 1; the device was evacuated almost to the vacuum state; and the sample was heated to 750° C. with a heater 5 placed in the center of the device and heaters 5 placed on the internal side wall 2 of the device. After the sample is heated to a particular temperature, an oxygen gas was introduced into the device 1 to a pressure of 0.75 Pa at a flow rate of 300 sccm, and the sample was oxidized while heated in the same condition for 20 minutes.

An alumina film was formed as follows: An alumina film of approximately 2 μm in thickness was formed by the reactive sputtering method, specifically by applying a pulse DC power of approximately 2.5 kW respectively to the two sputtering cathodes 6 having an aluminum target shown in FIG. 1, at a substrate temperature similar to that in the oxidation step in an argon and oxygen environment. The alumina film was formed at a discharge condition in a so-called transition mode, i.e., by controlling the discharge voltage and the flow rate ratio of argon/oxygen by plasma emission spectroscopy.

The crystal structure of the alumina film formed on the outmost layer was identified by analyzing the surface of the thin film thus formed with an X-ray diffractometer. FIG. 2 shows the thin-film X-ray diffraction pattern of the alumina film formed when the substrate (2) (TiAlN film) was used; FIG. 3, when the substrate (3) (CrN film) was used; and FIG. 4, when the substrate (1) (Si wafer) was used.

In FIG. 2, there are diffraction peaks indicating TiAlN and lower diffraction peaks indicating alumina in the γ crystal structure (hereinafter, referred to as "γ-alumina peak"), but the diffraction peaks indicating alumina in the alpha crystal structure (hereinafter, referred to as "alpha-alumina peak") are higher, suggesting that a quasi-alpha-alumina film is formed on the TiAlN film. FIG. 3, wherein the alpha-alumina peaks are higher, also indicates that a quasi-alpha-alumina film is formed also on the CrN film. In FIG. 3, peaks indicating chromium oxide formed by oxidation of the surface of the CrN film were also observed.

In contrast, there is no alpha-alumina peak observed in FIG. 4, suggesting that an alumina film mainly in the γ crystal structure is formed on the Si wafer.

<Experiment B>

Then, an alumina film was formed on each of the substrates (1) to (3) under the condition same as that of the experiment A, except that the substrate temperature was 700° C. slightly lower than that in the experiment A, and the alumina film obtained was analyzed with a thin-film X-ray diffractometer. The results for the substrate (2) (TiAlN film) are shown in FIG. 5; those for the substrate (3) (CrN film), in FIG. 6; and those for the substrate (1) (Si wafer), in FIG. 7.

Although both films in FIGS. 5 and 2 were formed on the same TiAlN film, it is apparent from the Figures that an alumina film formed in a lower temperature range has a higher intensity ratio of γ- to alpha-alumina peak, or a higher content of alumina in the γ crystal structure in the alumina formed, as shown in FIG. 5.

In addition, similar results were obtained when the substrate (3) (CrN film) was used. It is obvious from comparison between FIGS. 6 and 3 above, that there are in FIG. 6 γ-alumina peaks not found in FIG. 3, and that alumina in the γ crystal structure is easily formed when the film-forming temperature is in a lower temperature range.

When the substrate (1) (Si wafer) is used, there were only γ-alumina peaks observed as alumina peaks in FIG. 7, similarly to when the film-forming temperature was 750° C. (FIG. 4 above), indicating that only alumina in the γ crystal structure was formed at the film-forming temperature intended by the present invention.

After similar experiments by changing other conditions as well, the inventors have found that it was possible to form alumina in the alpha crystal structure, most easily when the substrate surface has a film containing Cr such as CrN and next easily when the substrate surface has a film containing Al such as TiAlN or Ti such as TiN or TiCN; and that it is also possible to form alumina in the alpha crystal structure, together with alumina in the γ crystal structure, even on substrates of high-speed steel or cemented carbide whereon no such a film was formed in the past. However, only alumina in the γ crystal structure was formed on a Si wafer, no matter how the condition was altered.

An object of the present invention, which was made under the circumstances above, is to provide a method of forming a quasi-alpha-alumina film not only on a substrate having a TiAlN film, CrN film, or the like formed on the surface thereof but also on a substrate such as a Si wafer, which hitherto allowed deposition only of alumina in the γ crystal structure at a temperature of approximately 800° C. or lower, at a relatively low temperature without deformation or decomposition of the substrate.

The inventors believe that it becomes possible to form a quasi-alpha-alumina film in a lower temperature range, independently of the kind of substrate, by establishing a method of forming a film on a substrate resistant to deposition of a quasi-alpha-alumina film in this manner.

Another object of the present invention is to provide a method of forming the quasi-alpha-alumina film on CrN or TiAlN that allows deposition of alpha-alumina at a lower film-forming temperature without contamination, for example, by alumina in the γ phase.

SUMMARY OF THE INVENTION

The method of producing an alumina film mainly in alpha crystal structure according to the present invention is characterized by processing the surface of a substrate with a ceramic powder mainly having the crystal structure same as that of alumina in the alpha crystal structure in forming the alumina film mainly in alpha crystal structure on the substrate (including a substrate having a film previously formed thereon).

The ceramic powder is preferably an oxide ceramic powder, preferably a ceramic powder having the same corundum structure (alpha crystal structure) as the alumina mainly in the alpha crystal structure, and more preferably alumina powder in the alpha crystal structure having an average particle diameter of 50 μm or less.

The substrate may have on the surface thereof a film of one or more compounds selected from the group consisting of compounds of one or more elements selected from the group consisting of the elements in Groups 4a, 5a and 6a in the periodic table, Al, Si and Y with one or more elements of C, N, B, and O, the solid solutions thereof, and compounds of one or more elements of C, N, and B. Typical examples thereof include substrates having a hard film containing one or more compounds selected from the group consisting of TiN, TiC, TiCN, TiAlN and TiAlCrN formed on the surface thereof.

These step of treating a substrate surface includes, for example, a step of polishing the substrate surface by using the ceramic powder (preferably the alumina powder), a step of immersing and ultrasonicating the substrate in a liquid containing the ceramic powder (preferably the alumina powder) dispersed, and the like.

The alumina film is preferably formed by a gas-phase growth method, and any method selected from the group consisting of CVD, PE-CVD, sputtering, ion plating, and vapor deposition may be used as the gas-phase growth method.

Accordingly, the present invention provides a method of producing a multilayer film-deposited product characterized by forming an alumina film mainly in alpha crystal structure on the film described above, and a method of producing a multilayer film-deposited product, characterized by including (1) a step of forming a hard film containing one or more compounds selected from the group consisting of TiN, TiC, TiCN, TiAlN and TiAlCrN on a substrate, (2) a step of treating the substrate surface with a ceramic powder mainly having the crystal structure same as that of alumina in the alpha crystal structure, and (3) a step of forming an alumina film mainly in alpha crystal structure on the substrate after the treatment, wherein the multilayer film-coated product is produced in that order.

BRIEF DESCRIPTION OF THE DRAWINGS

FIG. 17 is a chart showing the thin-film X-ray diffraction pattern of an alumina film formed on a TiAlN film previously immersed and ultrasonicated in ethanol containing dispersed diamond powder (film-forming temperature: 700° C.).

BEST MODE FOR CARRYING OUT THE INVENTION

Figure 1:
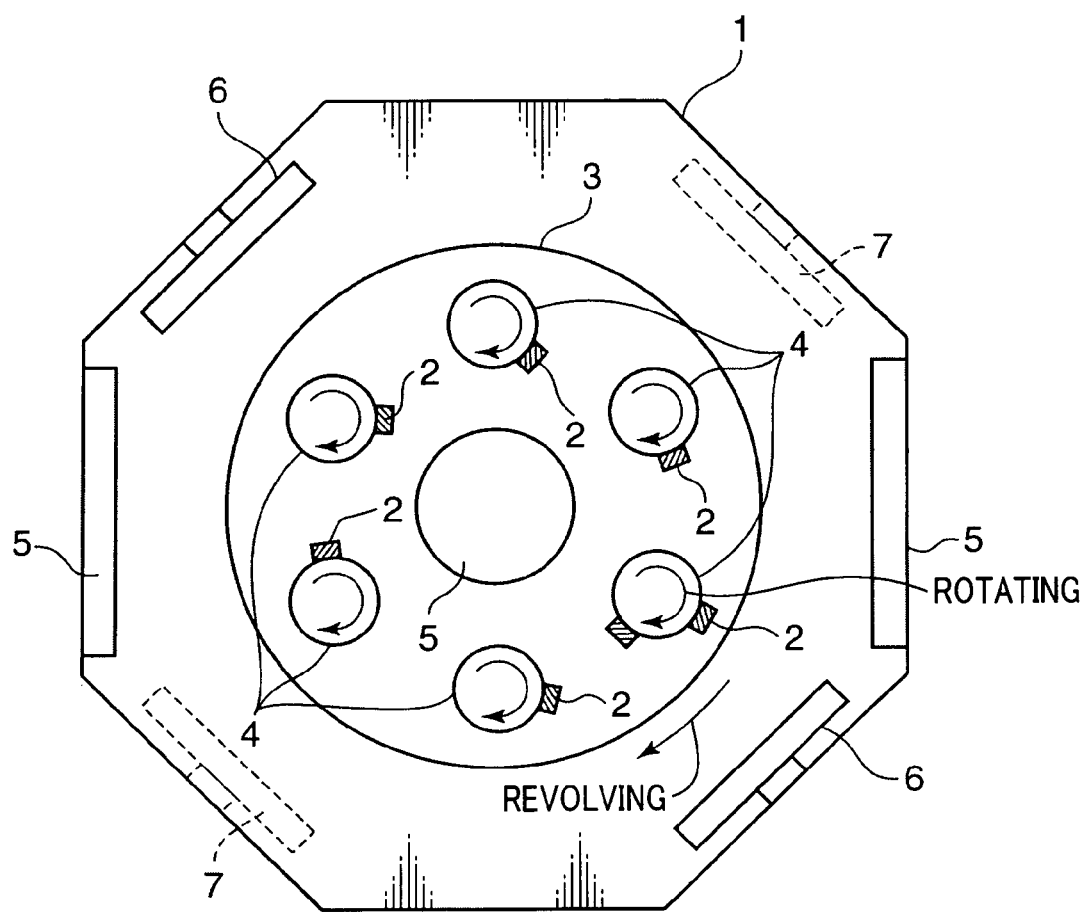
FIG. 1 is a schematic explanatory view (top view) illustrating a device used in working the present invention.
Figure 2:
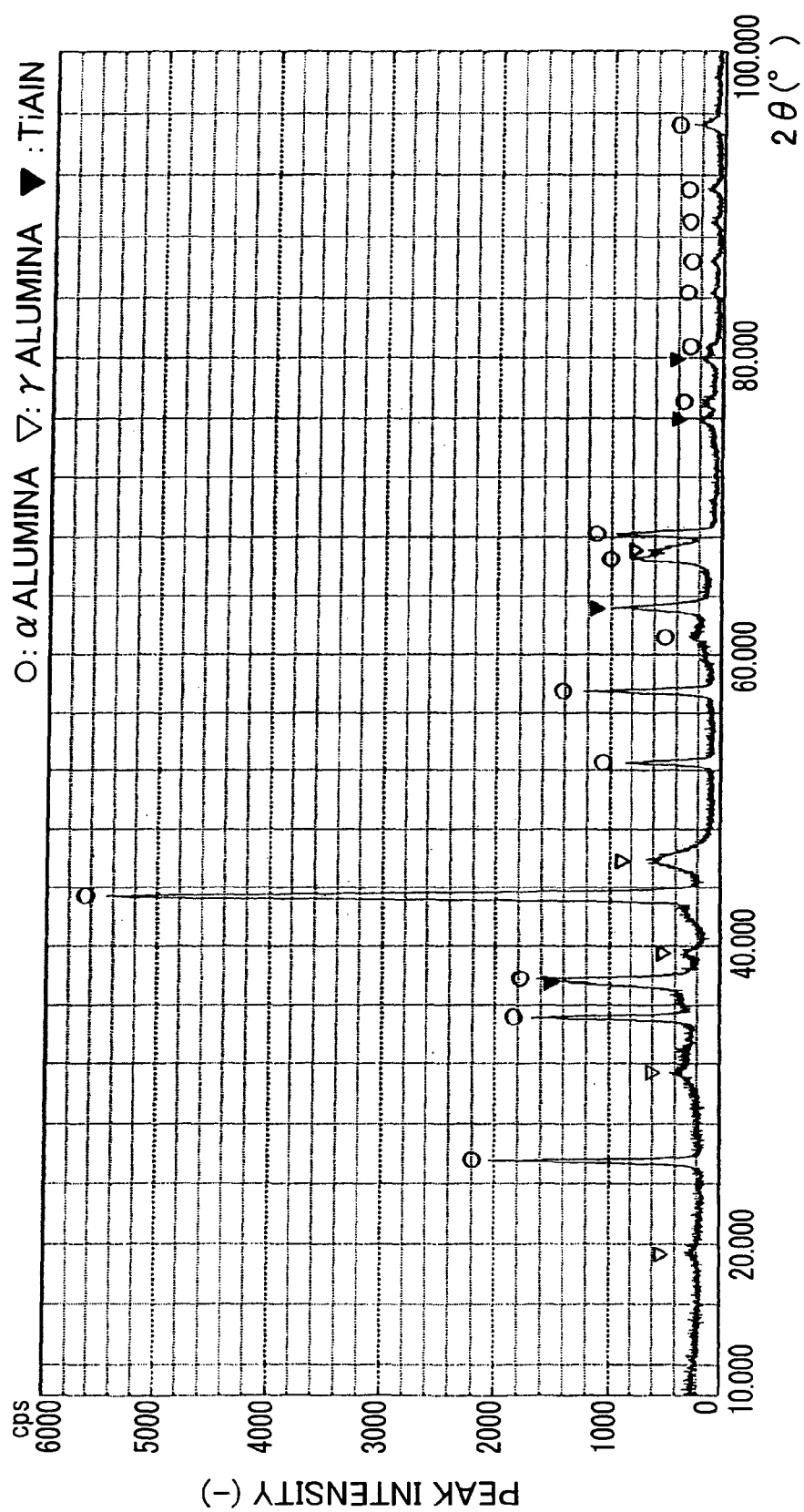
FIG. 2 is a chart showing the thin-film X-ray diffraction pattern of an alumina film formed on a TiAlN film (film-forming temperature: 750° C.).
Figure 3:
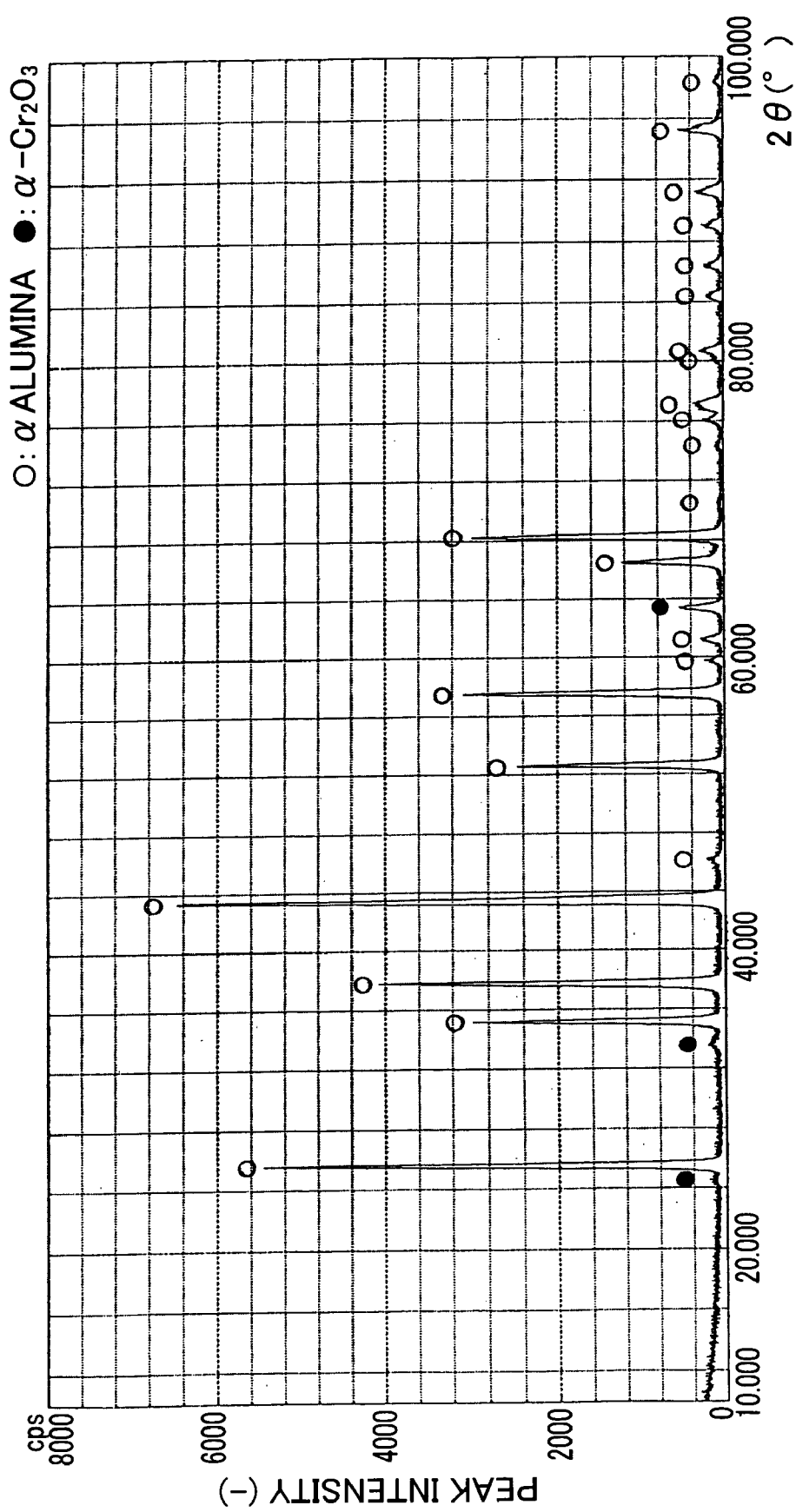
FIG. 3 is a chart showing the thin-film X-ray diffraction pattern of an alumina film formed on a CrN film (film-forming temperature: 750° C.).

Under the circumstances above, the inventors studied intensively from all angles on a method of forming an alumina film mainly in alpha crystal structure on a substrate in a relatively lower temperature range of about 800° C. or lower, independently of the kind of the substrate. As a result, the inventors have found that in forming an alumina film on a substrate (including a substrate having a film formed thereon), it is particularly effective to process a substrate surface by using a ceramic powder mainly having the crystal structure same as that of alumina in the alpha crystal structure (hereinafter, referred to simply as "pretreatment").

Such a finding was made on the basis of various experiments, and based on the facts obtained by the experiments, the mechanism, although not completely elucidated, is considered as follows:

The results of the experiments by the inventors suggest that the properties of the underlying substrate surface have a very important influence on generation of the crystal layer of alumina film.

Specifically, when the substrate surface having a TiAlN or CrN film thereon formed by AIP method, for example, is oxidized, the alumina in alpha crystal structure is often formed on the substrate. Aluminum oxide is formed on the outmost layer of the TiAlN film by the oxidation and $Cr_2O_3$ having the crystal structure same as that of alumina in alpha crystal structure is formed on the outmost layer of the CrN film; and presence of these metal oxides seems to provide a condition favorable for generation of alpha-alumina crystal nuclei during the initial phase of film formation.

On the contrary, as described above, when a Si wafer is used as the substrate, alumina in the alpha crystal structure is not formed at all, even if the film is formed under the condition same as that for the TiAlN or CrN film. It is presumably because a thin and dense $SiO_2$ film, which is formed on the surface of the Si wafer by oxidation of the Si wafer, is in a state unsuitable for generation of alpha-alumina crystal nuclei.

However, even if a Si wafer was also used as the substrate, an quasi-alpha-alumina film was formed at a film-forming temperature in the range of 700° C. and 750° C., if the Si wafer substrate before deposition of the alumina film was polished with alumina powder in the alpha crystal structure or immersed and ultrasonicated in a liquid in which the powder is dispersed.

On the other hand, when a Si wafer was used as the substrate and a diamond paste (diamond powder), hard powder similar to alumina powder, was used replacing the alumina powder, no quasi-alpha-alumina film was formed. Also when zirconia or silica ($SiO_2$) powder is used instead of the alumina powder in the similar treatment (ultrasonication), an alumina film mainly in γ crystal structure containing alumina in alpha crystal structure in a smaller amount was formed.

The fact that the quasi-alpha-alumina film is formed on a Si wafer only when the wafer is treated with alumina powder in alpha crystal structure suggests that fine scratches and dents reflecting the alpha crystal structure of alumina powder are formed on the Si wafer or a trace amount of the alumina powder in alpha crystal structure used is left on the substrate surface by the pretreatment and that the scratch and dent or the alumina powder remaining in a trace amount serve to start the generation of alpha-alumina crystal nuclei during alumina deposition.

In another experiment, alumina films were formed on a substrate having a hard film of CrN, TiAlN, or the like on the surface thereof, instead of on the Si wafer, at a substrate temperature of 700° C. similarly to above. As a result, when the pretreatment above is not done, a film containing mainly alpha-alumina and a slight amount of γ phase alumina was formed on the CrN while a film mixed with alpha- and γ-alumina was formed on the TiAlN. In contrast, when the surface of the hard film was pretreated with the alumina powder, the quasi-alpha-alumina film was formed both on CrN and TiAlN.

On the other hand, when the pretreatment was done using the powder of diamond, zirconia, or silica instead of the alumina powder, there was no effect to accelerate alpha-crystallization observed when the alumina powder was used. The phenomena seem to be caused by the reason same as that when the experiments were done using the Si wafer as a substrate.

From the consideration above, the inventors have found that, in forming an alumina film on a substrate (including a substrate having a film formed thereon), it is effective to treat the substrate surface by using a ceramic powder mainly having the crystal structure same as that of alumina in the alpha crystal structure.

Examples of the methods of treating the substrate surface include polishing of the substrate surface by using a ceramic powder such as alumina powder as in the experiment above, immersion and ultrasonication of the substrate in a liquid in which the powder is dispersed, and other similar processing methods including shot blasting, wet honing, barrel wear, and the like.

Examples of the ceramic powders for use in the pretreatment include metal oxides, metal nitrides, metal borides, metal carbides, metal carbide/nitrides, and the like; and specific examples thereof include alumina in alpha crystal structure, the ceramic powders having the crystal structure same as that of the alumina in alpha crystal structure such as $Cr_2O_3$ and $Fe_2O_3$; and the like. An alumina powder in alpha crystal structure identical with that in the alumina film to be formed on the outmost layer is preferably used.

The size of the alumina powder is preferably smaller, from the purpose of forming a thin dense alumina film, and specifically, and the average particle diameter of the alumina used is preferably 50 μm or less and more preferably 1 μm or less.

Examples of the substrates for use in the present invention include Si wafer, cemented carbide, high-speed steel, glass, sintered cBN (cubic boron nitride), and the like, or the composites thereof carrying an additional film formed thereon. A film of one or more compounds selected from the group consisting of compounds of one or more elements selected from the group consisting of elements in Groups 4a, 5a and 6a in the periodic table, Al, Si and Y with one or more elements of C, N, B, and O; the solid solutions thereof; and compounds of one or more elements of C, N and B (for example, diamond, DLC, carbon nitride, and boron nitrides such as cBN, and boron carbide such as $B_4C$), may be formed on the substrate surface. Typical examples thereof include hard films containing one or more compounds selected from the group consisting of TiN, TiC, TiCN, TiAlN and TiAlCrN.

In addition, in forming an alumina film, it is preferable to oxidize the substrate after the pretreatment according to the present invention, because the quasi-alpha-alumina film is formed more easily. In such a case, it is preferable to oxidize the substrate in an alumina film-deposition device, since it enables to form an alumina film subsequently on the substrate still retaining the temperature during the oxidation, thus leading to a preservation of the properties of the substrate and the film and a excellent productivity.

One of the favorable oxidation methods is a thermal oxidation method of oxidizing a substrate in an environment of an oxidative gas at a higher substrate temperature. Another favorable method that may be used is a method of irradiating an oxidative gas in the plasma state.

The thickness of the alumina film formed is preferably 0.1 to 20 μm. It is because a thickness of 0.1 μm or more is effective for ensuring the superior heat resistance of the alumina film, and the thickness is more preferably 0.5 μm or more and still more preferably 1 μm or more. However, an excessively larger thickness of the alumina film, which often results in generation cracks in the alumina film due to an internal stress formed therein, is not favorable. Accordingly, the film thickness is preferably 20 μm or less, more preferably 10 μm or less, and still more preferably 5 μm or less.

The method of forming the alumina film is not particularly limited in the present invention, and may be any one of gas-phase growth methods such as CVD, PE-CVD, sputtering, ion plating, and vapor deposition; among them, it is preferable to use the sputtering method, a PVD method allowing film deposition in a lower-temperature range; and reactive sputtering is particularly preferable, because it allows high deposition rote by using an inexpensive metal target.

The substrate temperature during deposition of the alumina film is not specified here, but as described above, deposition of an alumina film subsequently done after the oxidation step is preferably performed at a temperature of approximately 650 to 800° C.

The present invention allows deposition of the quasi-alpha-alumina film on various substrates without being restricted to film-coated substrates and thus, is applicable in a wide variety of fields: for example, production of multilayer film-coated parts such as cutting tool and sliding parts, by forming a quasi-alpha-alumina film on a substrate having a hard film, for example of TiAlN, thereon; use as a substitute for sapphire (single crystalline alumina), by forming the quasi-alpha-alumina film on a Si wafer substrate; production of parts superior in plasma resistance, by forming the quasi-alpha-alumina film on a quartz glass; use as a high-heat-resisting insulating film, by forming the quasi-alpha-alumina film on a heat resistant alloy; and use as a cutting tool or the like, by forming the quasi-alpha-alumina film directly on an cemented carbide, sintered cBN, or high-speed steel substrate.

EXAMPLES

Hereinafter, the present invention will be described more specifically with reference to Examples, but it should be understood that the present invention is not restricted by the following Examples and all modifications that may be conducted in the scope of the descriptions above and below are also included in the technical scope of the present invention.

Example 1

A Si wafer substrate (size: ca. 20 mm×20 mm) was pretreated under each of the following three conditions (A) to (C) and washed to give a substrate having a clean surface; the substrate was then oxidized; and an alumina film was formed thereon. Alumina powder having an average particle diameter of 1 μm and a composition of $Al_2O_3$ of 99.7 mass % was used as the following alumina powder. The fact that the alumina powder mainly had alpha crystal structure was confirmed separately by X-ray diffraction analysis.

(A) Without pretreatment (B) The substrate surface is polished with a buff cloth coated with alumina powder (C) The substrate is immersed and ultrasonicated for 6 minutes in ethanol in which 0.25 g/mL of alumina powder is dispersed Oxidation of the substrate and deposition of an alumina film were performed in the vacuum deposition device shown in FIG. 1 (AIP-S40 hybrid coater machine, manufactured by Kobe Steel).

The substrate was oxidized in the following manner: A substrate 2 after the pretreatment above and normal washing was connected to one of the planetary revolving jigs 4 on the revolving table 3 of the device 1; the device was then evacuated almost into the vacuum state; the sample was heated to 750° C. with a heater 5 placed in the center of the device and heaters 5 placed on the internal side wall 2 of the device. After the sample is heated to a particular temperature, an oxygen gas was introduced into the device 1 to a pressure of 0.75 Pa at a flow rate of 300 sccm, and the sample was oxidized while heated in the same condition for 20 minutes.

The oxidation and the alumina deposition described below were performed while revolving the table 3 shown in FIG. 1 described above and rotating the planetary revolving jig 4 (substrate-holding pipe) placed thereon.

An alumina film was formed as follows: An alumina film of approximately 2 μm in thickness was formed by a reactive sputtering method, specifically by applying a pulse DC power of approximately 2.5 kW respectively to the two sputtering cathode 6 having an aluminum target shown in FIG. 1, at a substrate temperature similar to that in the oxidation step in an argon and oxygen environment. The alumina film was formed at a discharge condition in a so-called transition mode, i.e., by controlling the discharge voltage and the flow rate ratio of argon/oxygen by plasma emission spectroscopy.

Figure 8:
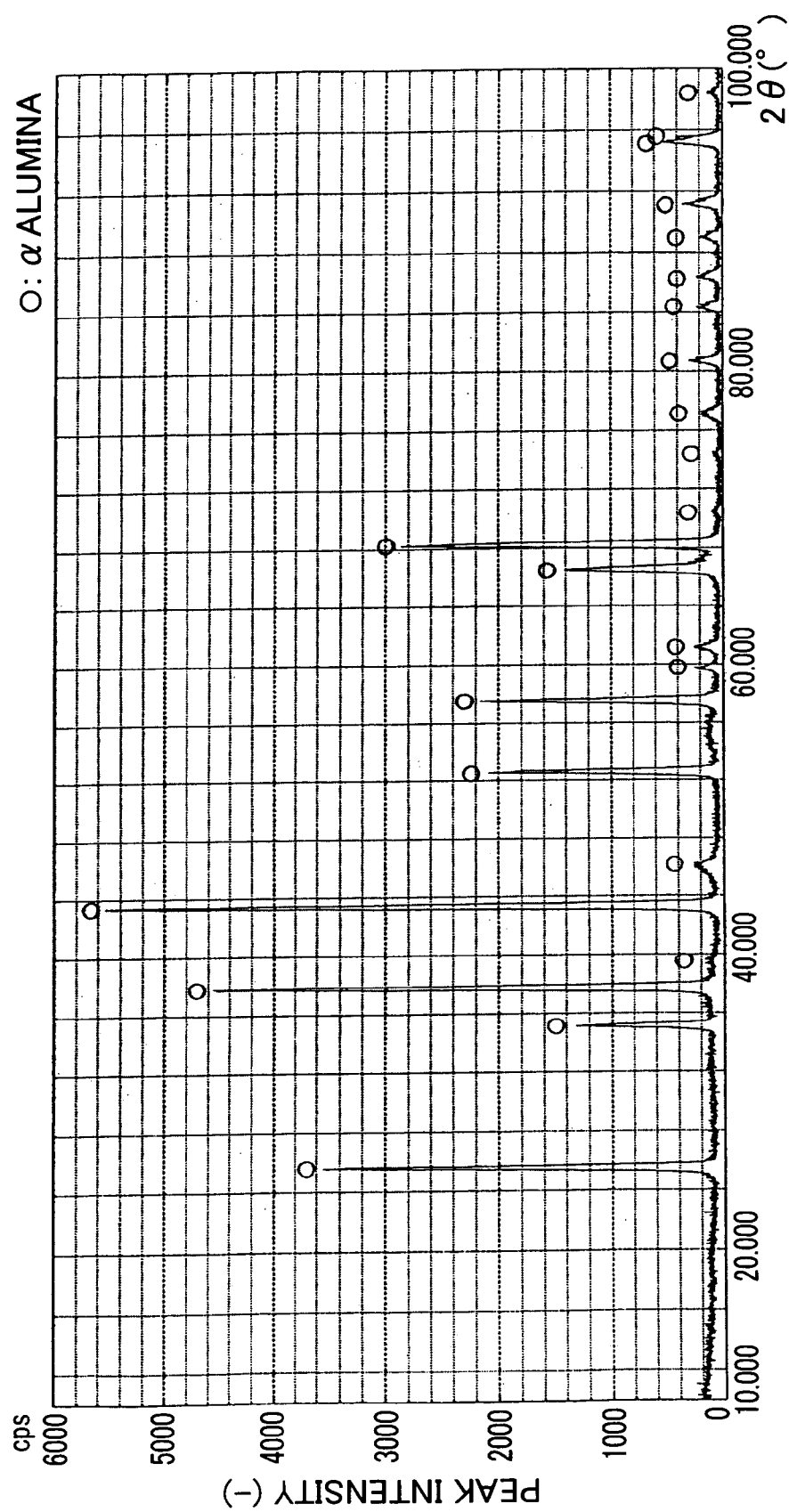
FIG. 8 is a chart showing the thin-film X-ray diffraction pattern of an alumina film formed on a Si wafer previously polished with alumina powder (film-forming temperature: 750° C.).
Figure 9:
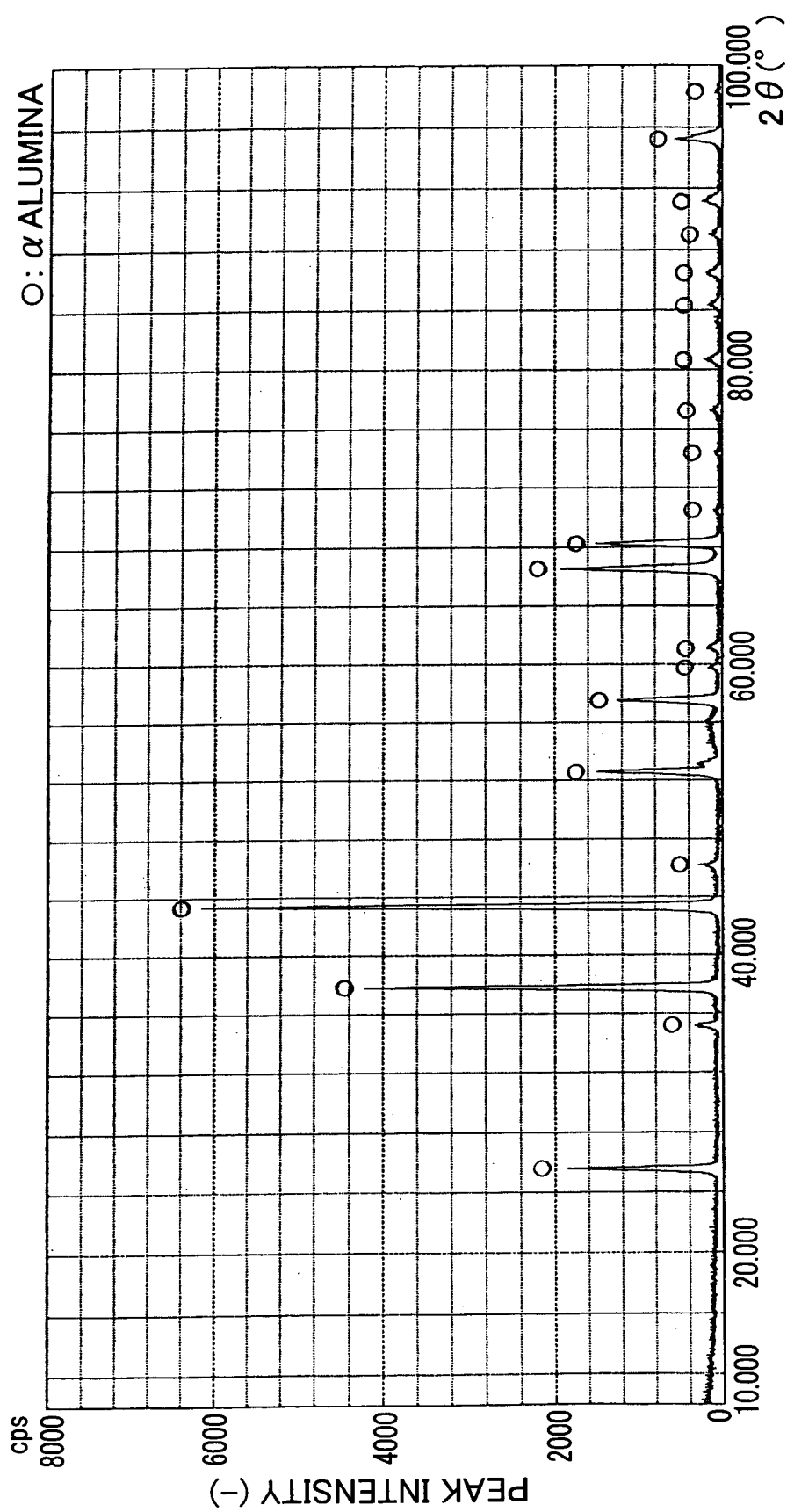
FIG. 9 is a chart showing the thin-film X-ray diffraction pattern of an alumina film formed on a Si wafer previously immersed and ultrasonicated in ethanol containing dispersed alumina powder (film-forming temperature: 750° C.).

The crystal structure of the alumina film formed on the outmost layer was identified by analyzing the surface of the thin film thus formed with an X-ray diffractometer. The results are shown in FIGS. 4, 8, and 9.

Figure 4:
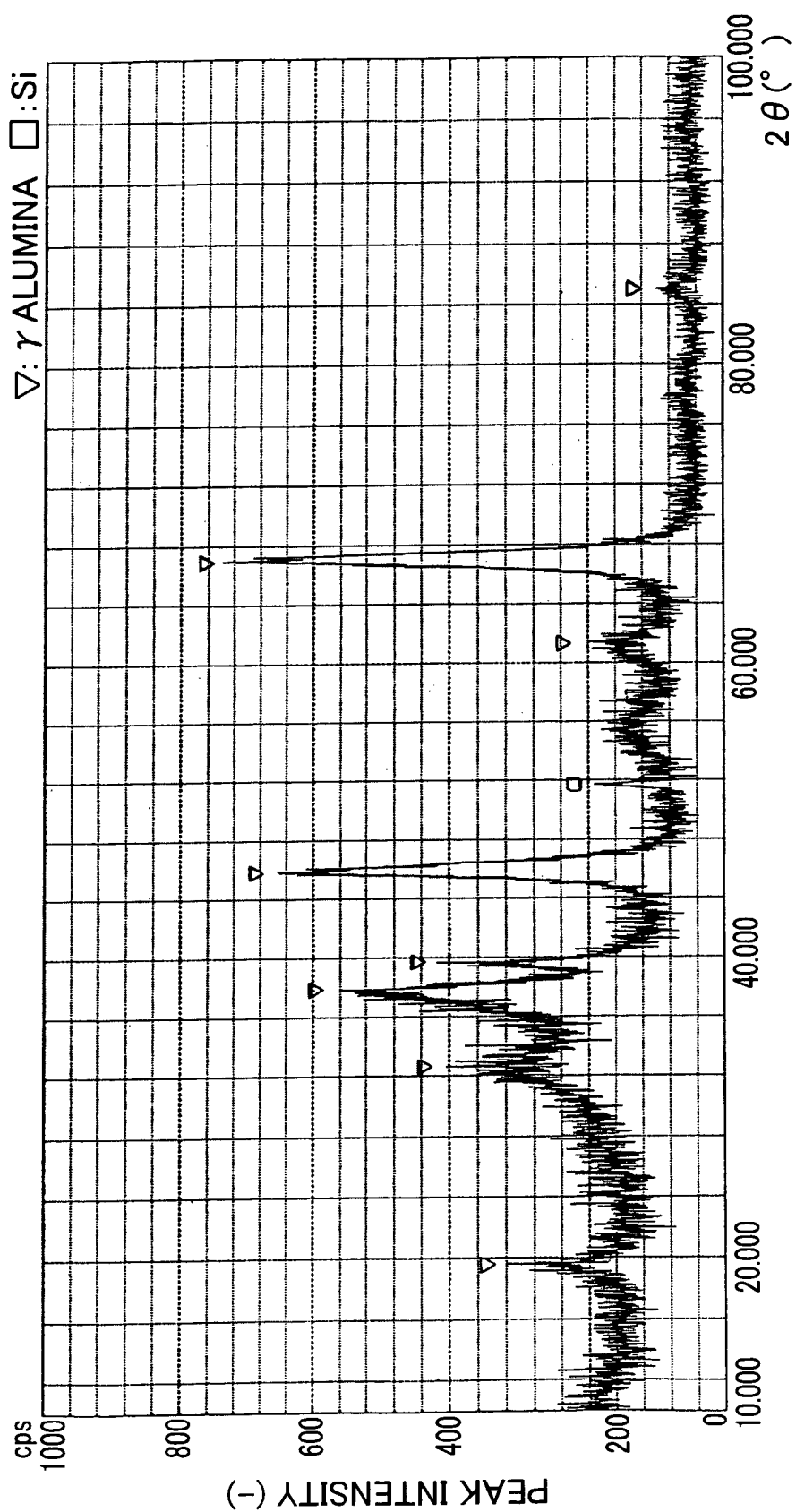
FIG. 4 is a chart showing the thin-film X-ray diffraction pattern of an alumina film formed on a Si wafer (film-forming temperature: 750° C.).

FIG. 4 shows the results obtained under the condition (a), i.e., without the pretreatment according to the present invention, and as apparent from FIG. 4, there is only alumina in γ crystal structure formed. In contrast, FIG. 8 shows the results obtained when the substrate was polished under the condition (b) (polishing with alumina powder) and FIG. 9 shows the results obtained when the substrate is pretreated under the condition (c) (immersion and ultrasonication in ethanol containing dispersed alumina powder); and these FIGS. 8 and 9 indicate that the alumina films formed have the alpha crystal structure mainly.

It was confirmed from the results above that it was possible to form a quasi-alpha-alumina film also on a substrate such as Si wafer, on which it was difficult to form such a quasi-alpha-alumina film by conventional methods, when the substrate was pretreated under the condition according to the present invention in forming the alumina film.

Example 2

The following two substrates (i) and (ii) were prepared.

(i) Si wafer (ii) Cemented carbide substrate (12.7 mm×12.7 mm×5 mm) polished to mirror surface (Ra: approximately 0.02 μm), washed by ultrasonic cleaning in an alkali tank and in a purified water tank, dried and formed with a TiAlN film of approximately 2 μm in thickness thereon by AIP method Then, the substrate was pretreated under one of the following five conditions (D) to (H) and washed to give a substrate having a clean surface, and then the substrate was processed in a similar manner to Example 1 above, except that the substrate was oxidized and an alumina film was formed thereon at a substrate temperature of 700° C. (lower by 50° C. than that in Example 1 above). Alumina powder similar to that used in Example 1 was used as the following alumina powder, and diamond powder having a particle diameter of 0.5 μm was used as the following diamond powder (diamond paste).

(D) Without pretreatment (E) The substrate surface is polished with a buff cloth coated with alumina powder (F) The substrate is immersed and ultrasonicated for 6 minutes in ethanol dispersed with alumina powder (G) The substrate surface is polished with a buff cloth coated with diamond powder (H) The substrate is immersed and ultrasonicated for 6 minutes in an ethanol dispersed with diamond powder The crystal structure of the alumina film formed on the outmost layer was identified by analyzing the surface of the film thus formed with a thin-film X-ray diffractometer.

Figure 7:
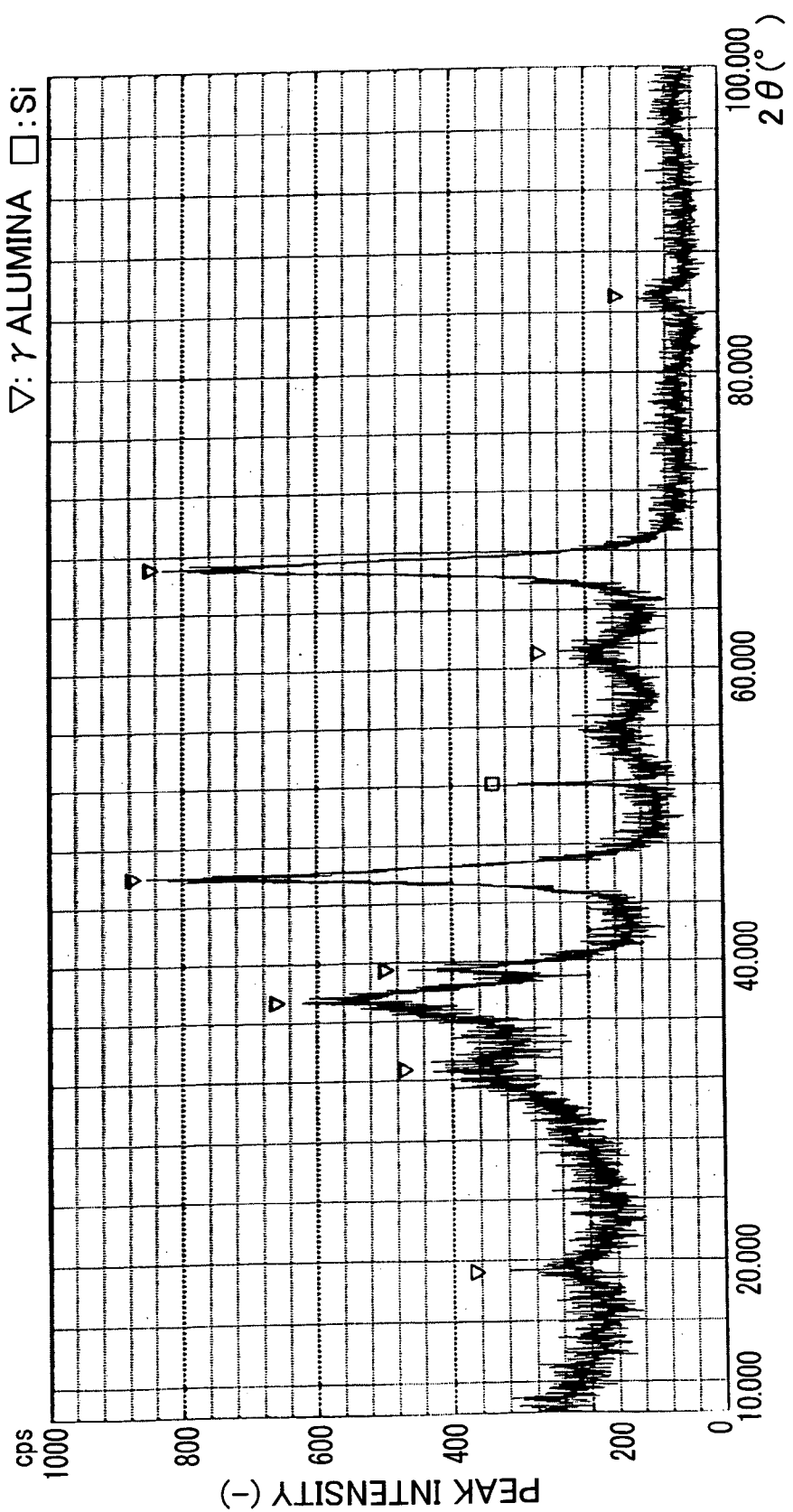
FIG. 7 is a chart showing the thin-film X-ray diffraction pattern of an alumina film formed on a Si wafer (film-forming temperature: 700° C.).

First, results obtained when the Si wafers (i) were respectively pretreated under the conditions of D to H are shown in FIGS. 7 and 10 to 13. FIG. 7 shows the results obtained under the condition (D), i.e., when the substrate was not pretreated under the condition according to the present invention; and it is obvious from FIG. 7 that an alumina film mainly in γ crystal structure was formed as the alumina film.

Figure 10:
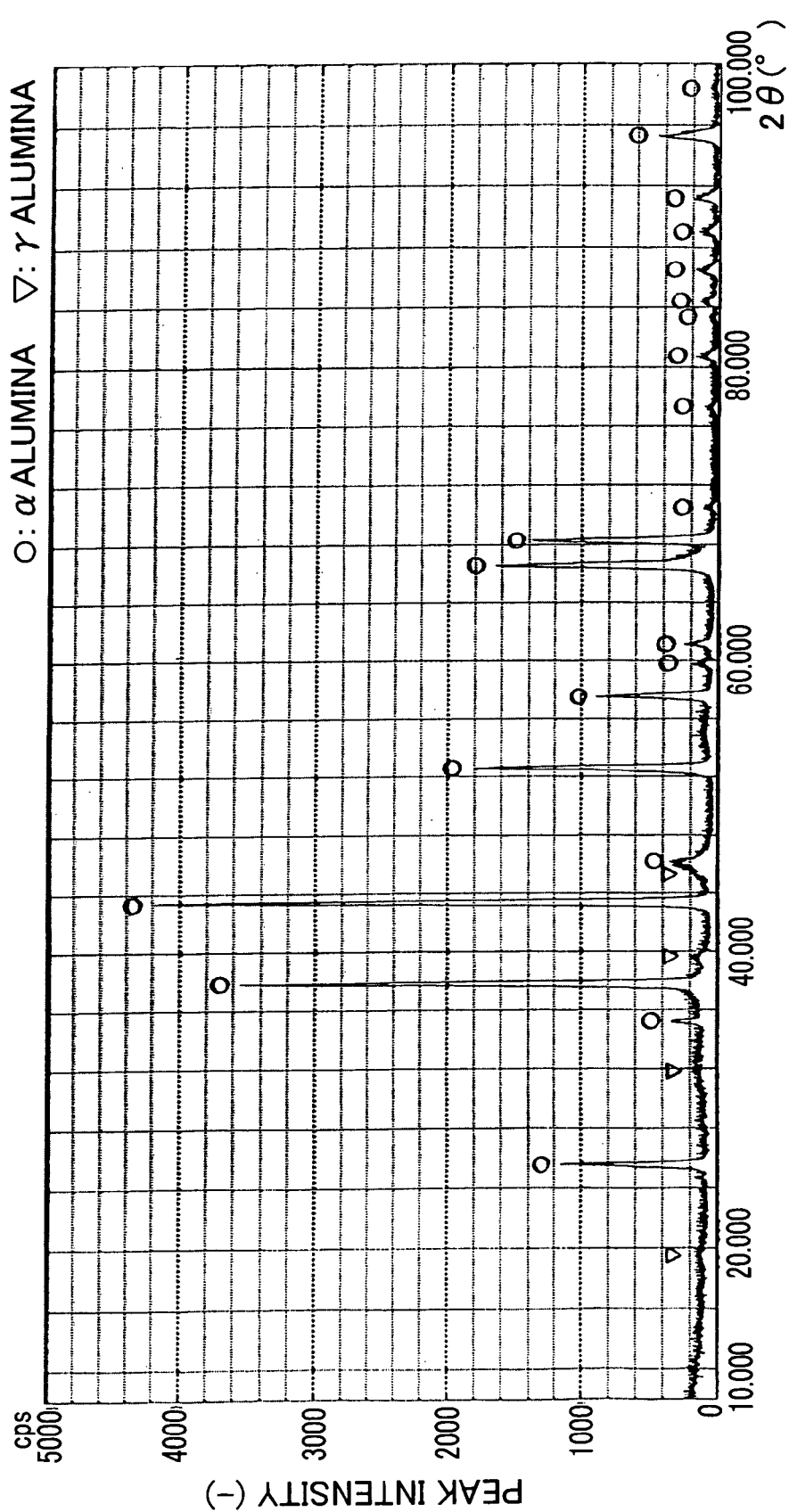
FIG. 10 is a chart showing the thin-film X-ray diffraction pattern of an alumina film formed on a Si wafer previously polished with alumina powder (film-forming temperature: 700° C.).
Figure 11:
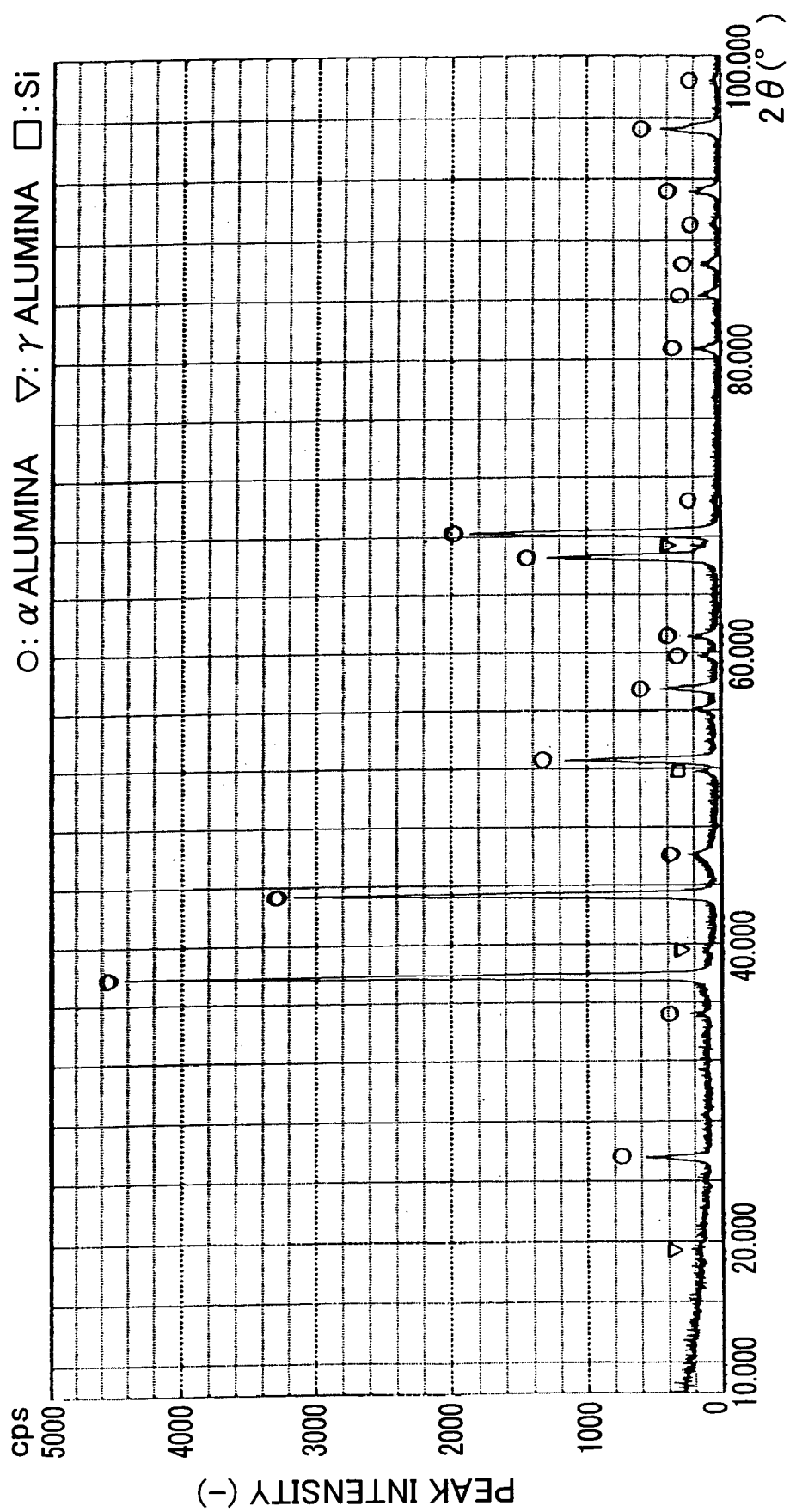
FIG. 11 is a chart showing the thin-film X-ray diffraction pattern of an alumina film formed on a Si wafer previously immersed and ultrasonicated in ethanol containing dispersed alumina powder (film-forming temperature: 700° C.).

In contrast, FIG. 10 shows the results obtained when the substrate was pretreated under the condition (E) (polishing with alumina powder), and FIG. 11 when the substrate was pretreated under the condition (F) (immersion and ultrasonication in ethanolic dispersion of alumina powder); and FIGS. 10 and 11, wherein there are small γ-alumina peaks together with large alpha-alumina peaks, showing that a quasi-alpha-alumina film was formed.

These results indicates that it is possible to form a quasi-alpha-alumina film even at a temperature of 700° C. in the range lower than that of Example 1, by pretreating the substrate with the ceramic powder (alumina powder) according to the present invention.

Figure 12:
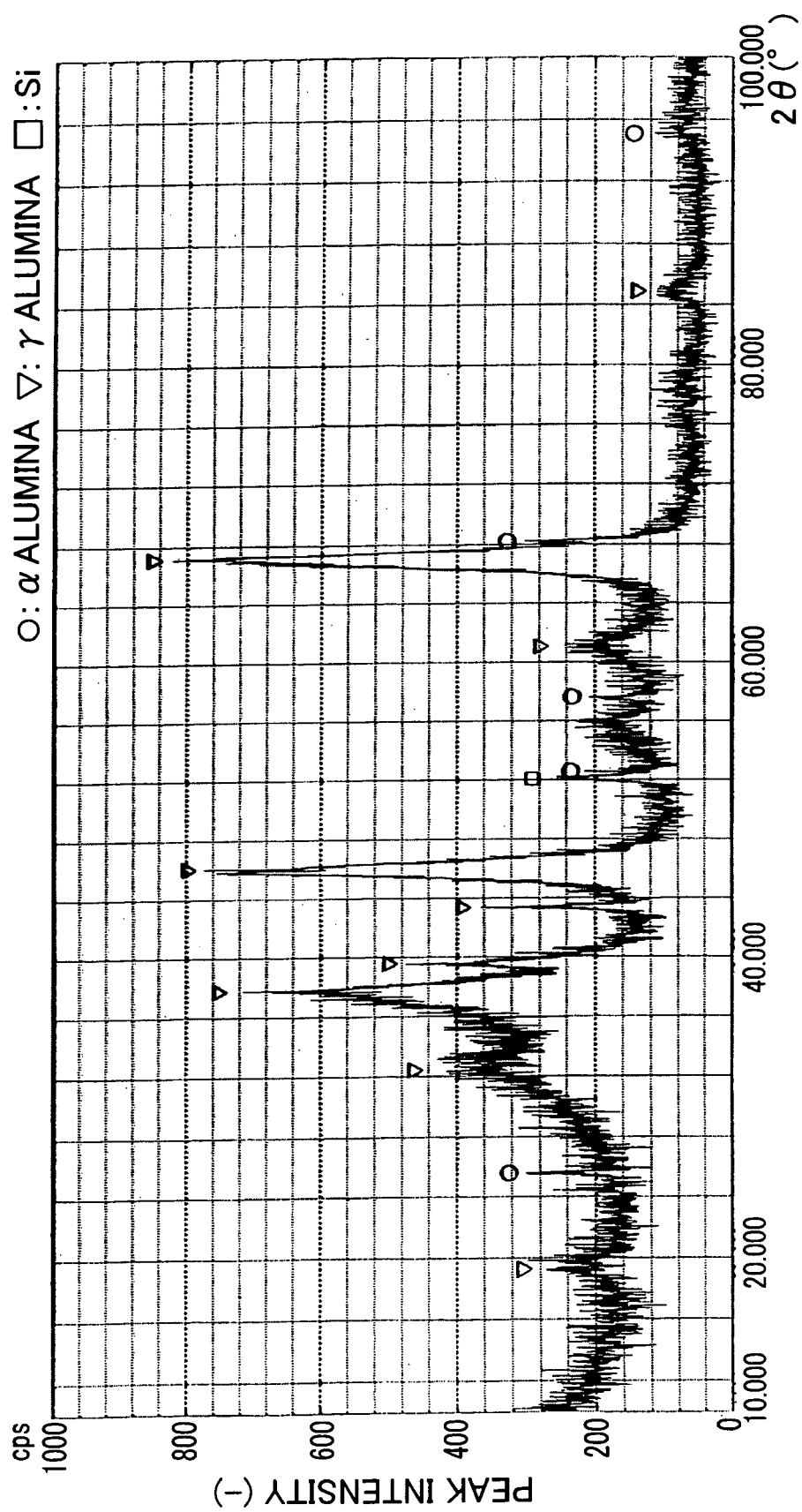
FIG. 12 is a chart showing the thin-film X-ray diffraction pattern of an alumina film formed on a Si wafer previously polished with diamond powder (film-forming temperature: 700° C.).
Figure 13:
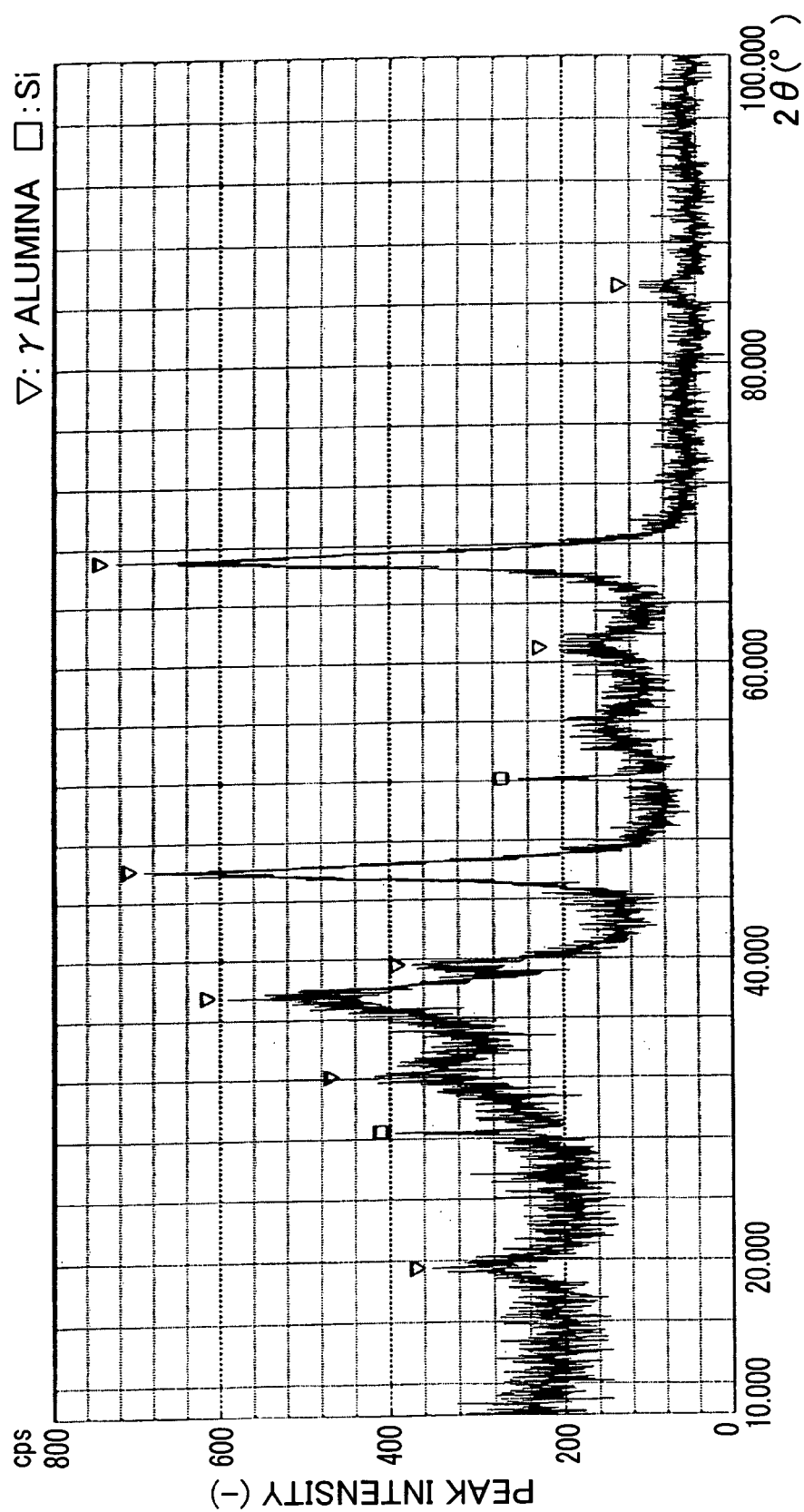
FIG. 13 is a chart showing the thin-film X-ray diffraction pattern of an alumina film formed on a Si wafer previously immersed and ultrasonicated in ethanol containing dispersed diamond powder (film-forming temperature: 700° C.).

As Comparative Examples, the results obtained when the substrate was pretreated under the condition (G) (polishing with diamond powder) are shown in FIG. 12, and the results obtained when the substrate was pretreated under the condition (H) (immersion and ultrasonication in an ethanolic dispersion of diamond powder) in FIG. 13.

In FIG. 12, there are small alpha-alumina peaks as well as large γ-alumina peaks, while in FIG. 13, the peaks indicating alumina are all γ-alumina peaks, and thus both Figures indicate that a film mainly containing γ-alumina was formed.

Comparison between FIG. 10 (polishing with alumina powder) and FIG. 12 (polishing with diamond powder), and also between FIG. 11 (ultrasonication by using alumina powder) and FIG. 13 (ultrasonication by using diamond powder) reveals that the hard powder for use in pretreatment is preferably the alumina powder according to the present invention.

The results obtained when the substrate (ii) (cemented carbide having a TiAlN film formed thereon) was used as the substrate and pretreated under the conditions of D to H are shown in FIGS. 5 and 14 to 17.

Figure 5:
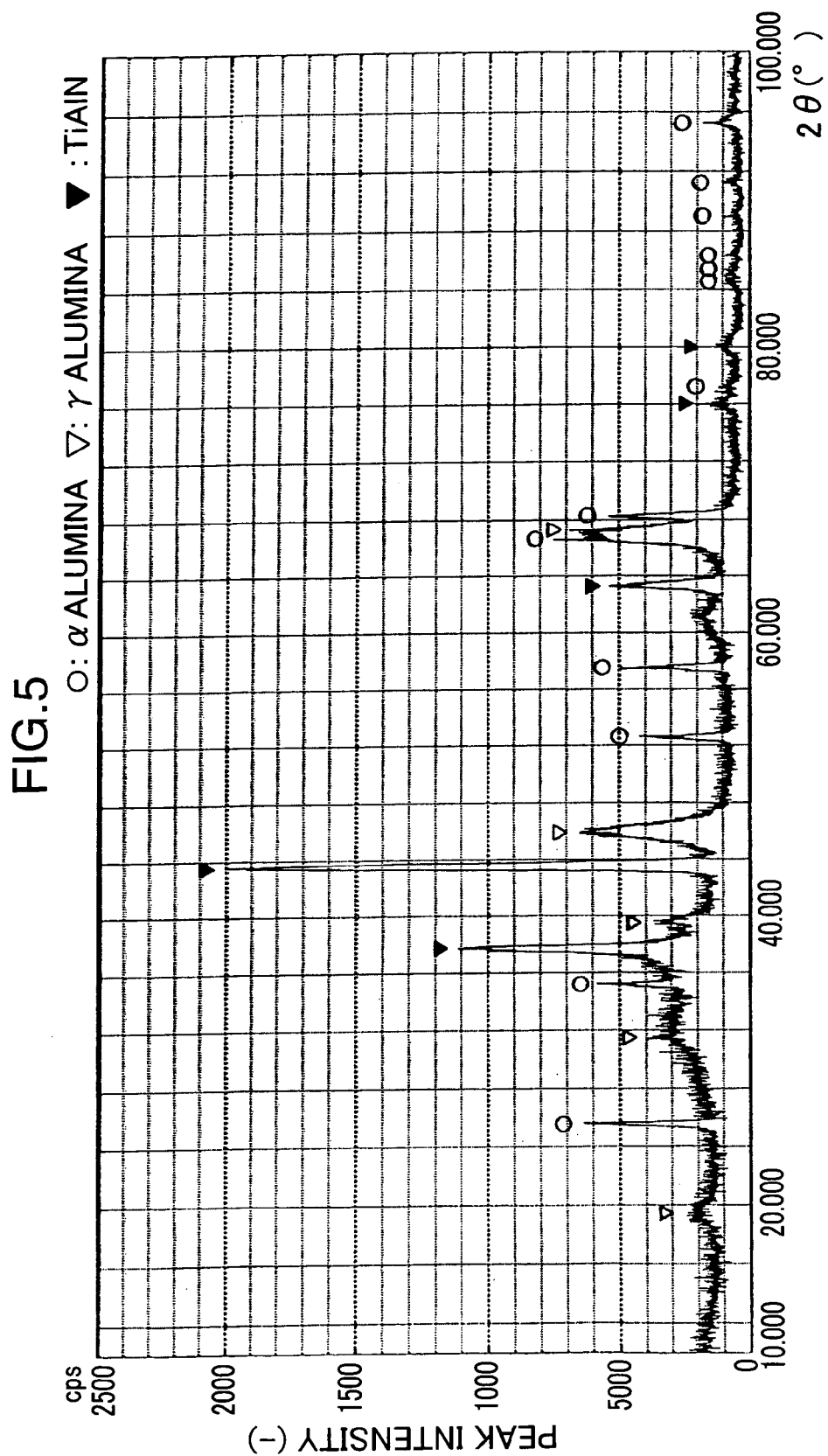
FIG. 5 is a chart showing the thin-film X-ray diffraction pattern of an alumina film formed on a TiAlN film (film-forming temperature: 700° C.).
Figure 6:
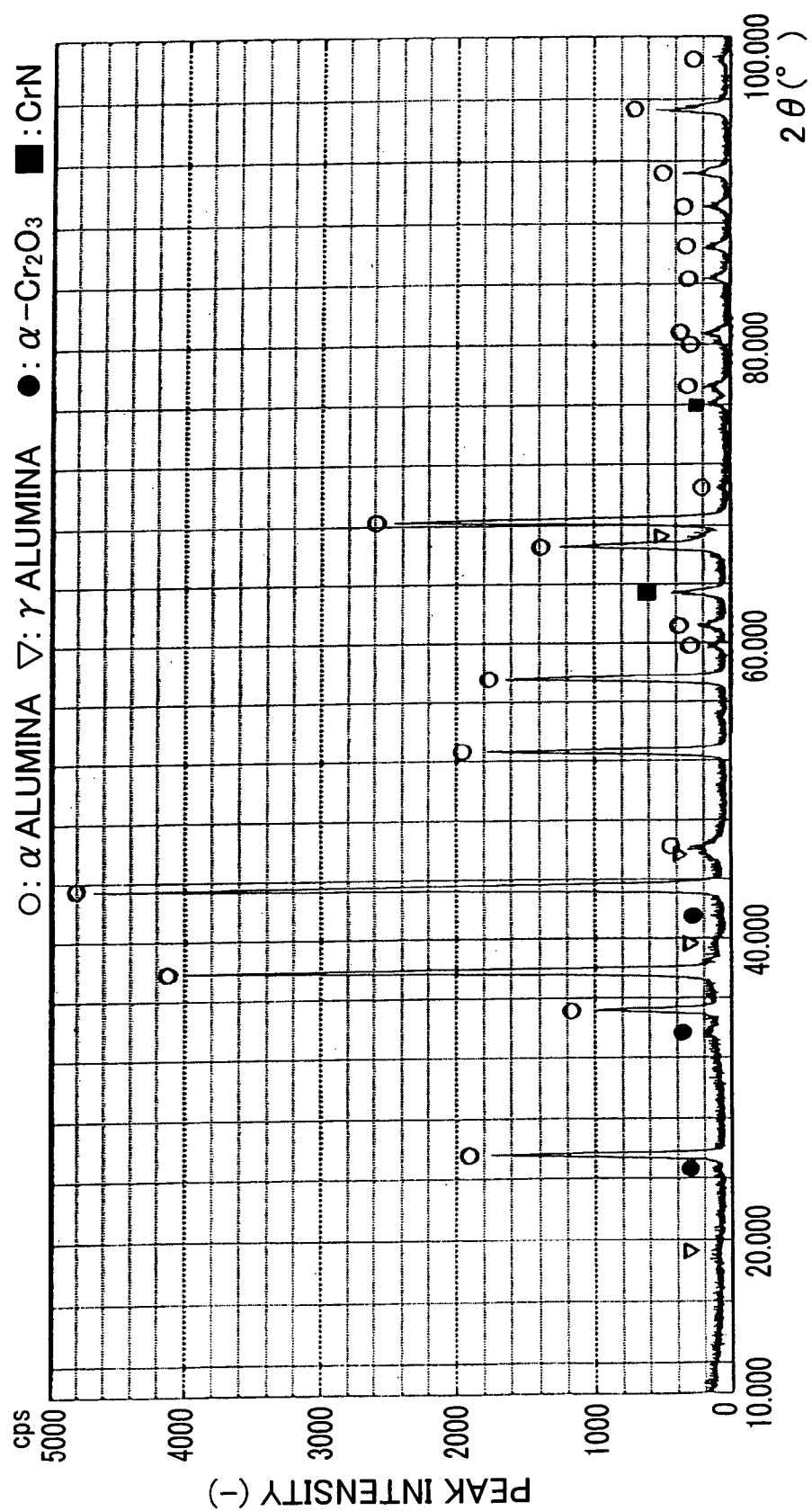
FIG. 6 is a chart showing the thin-film X-ray diffraction pattern of an alumina film formed on a CrN film (film-forming temperature: 700° C.).

FIG. 5 shows the results obtained when the substrate was pretreated under the condition (D) (without pretreatment). FIG. 5, wherein the γ-alumina peaks are relatively higher than alpha-alumina peaks, indicates a mixture of both alpha and γ crystal structures.

Figure 14:
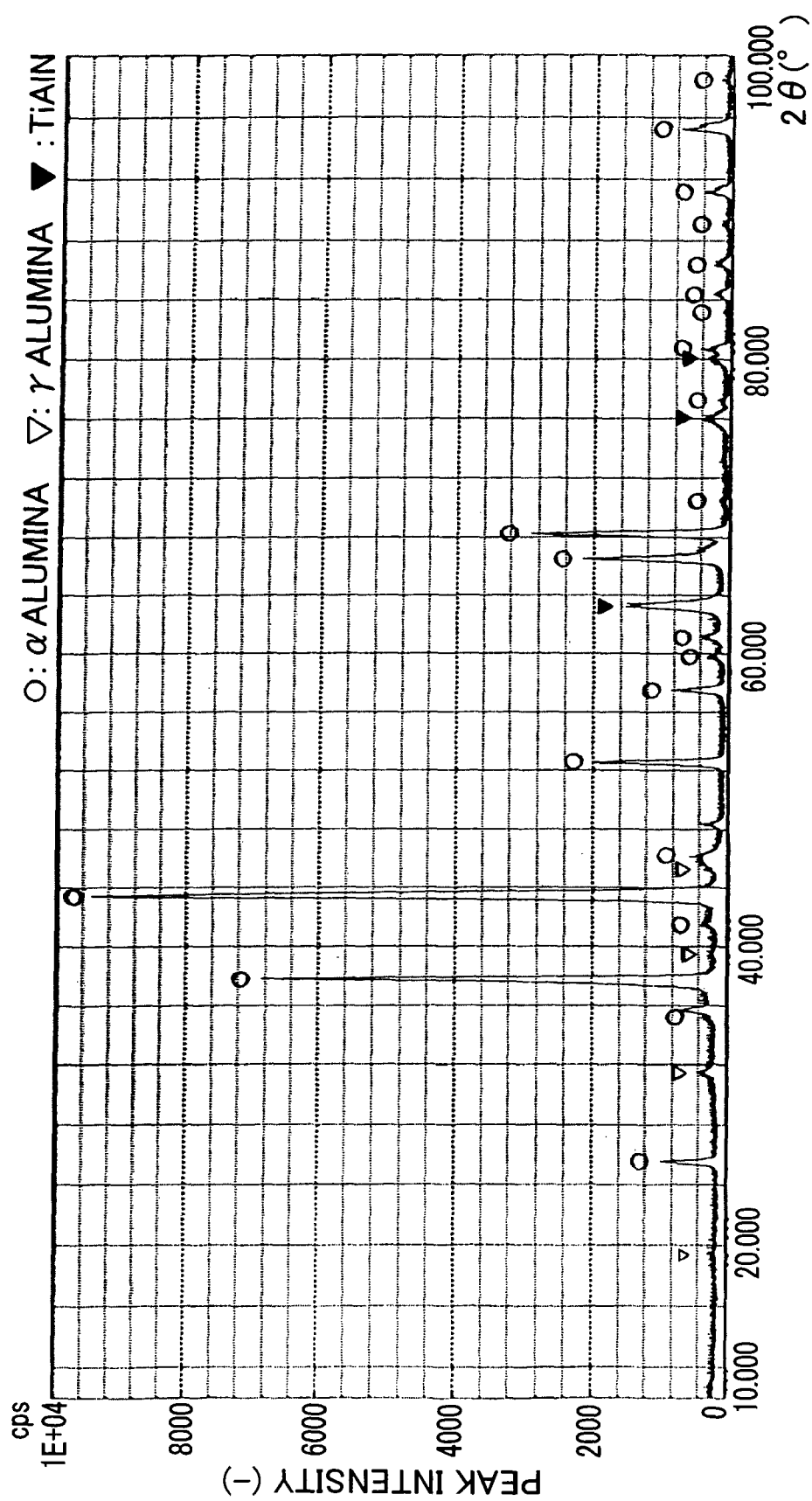
FIG. 14 is a chart showing the thin-film X-ray diffraction pattern of an alumina film formed on a TiAlN film previously polished with alumina powder (film-forming temperature: 700° C.).
Figure 15:
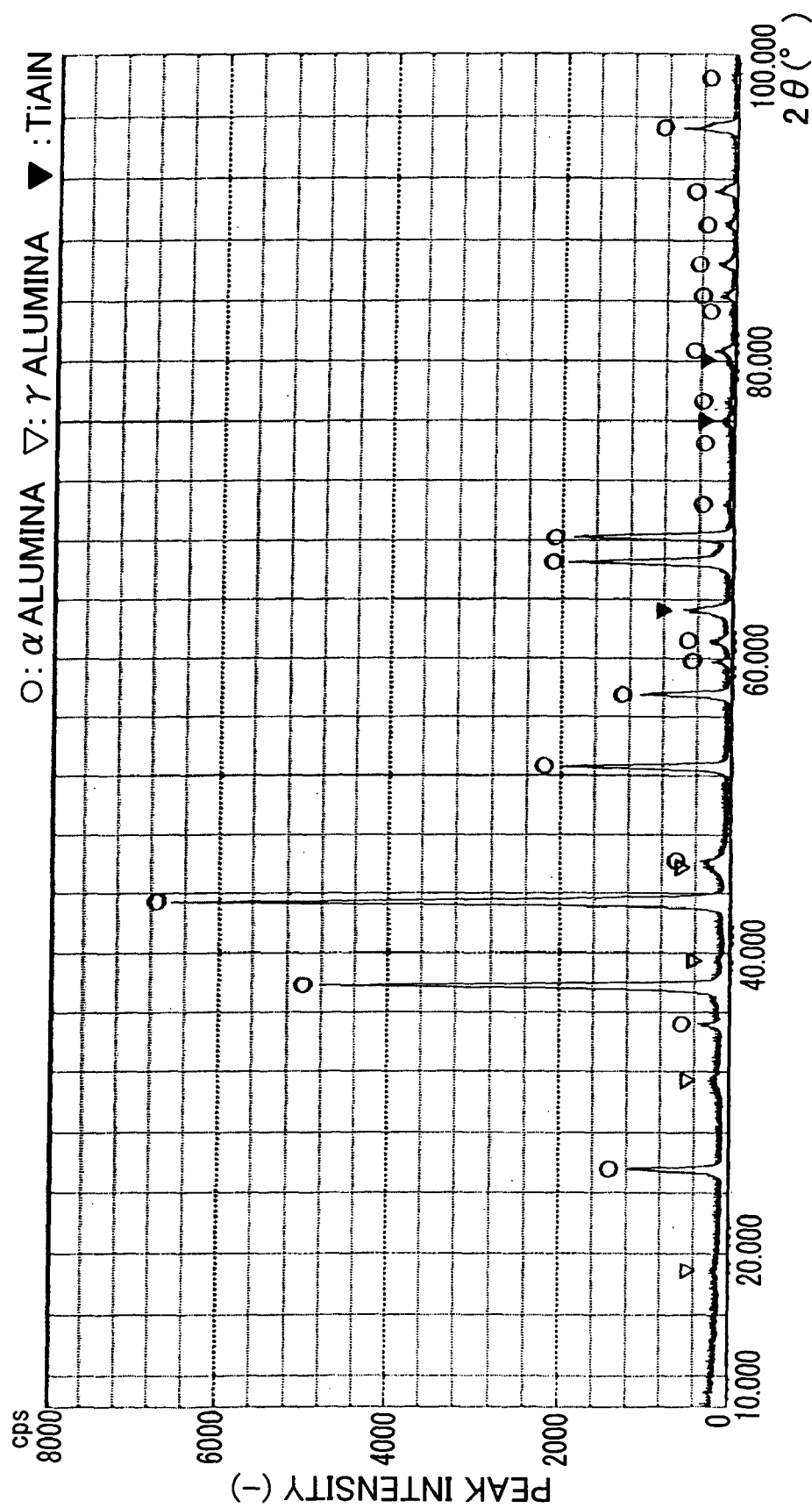
FIG. 15 is a chart showing the thin-film X-ray diffraction pattern of an alumina film formed on a TiAlN film previously immersed and ultrasonicated in ethanol containing dispersed alumina powder (film-forming temperature: 700° C.).

In contrast, FIG. 14 shows the results obtained when the substrate was pretreated under the condition (E) (polishing with alumina powder) and FIG. 15 when it was pretreated under the condition (F) (ultrasonication in ethanolic dispersion of alumina powder); and FIGS. 14 and 15, wherein the γ-alumina peaks are very small, indicate that the quasi-alpha-alumina film was formed favorably.

Figure 16:
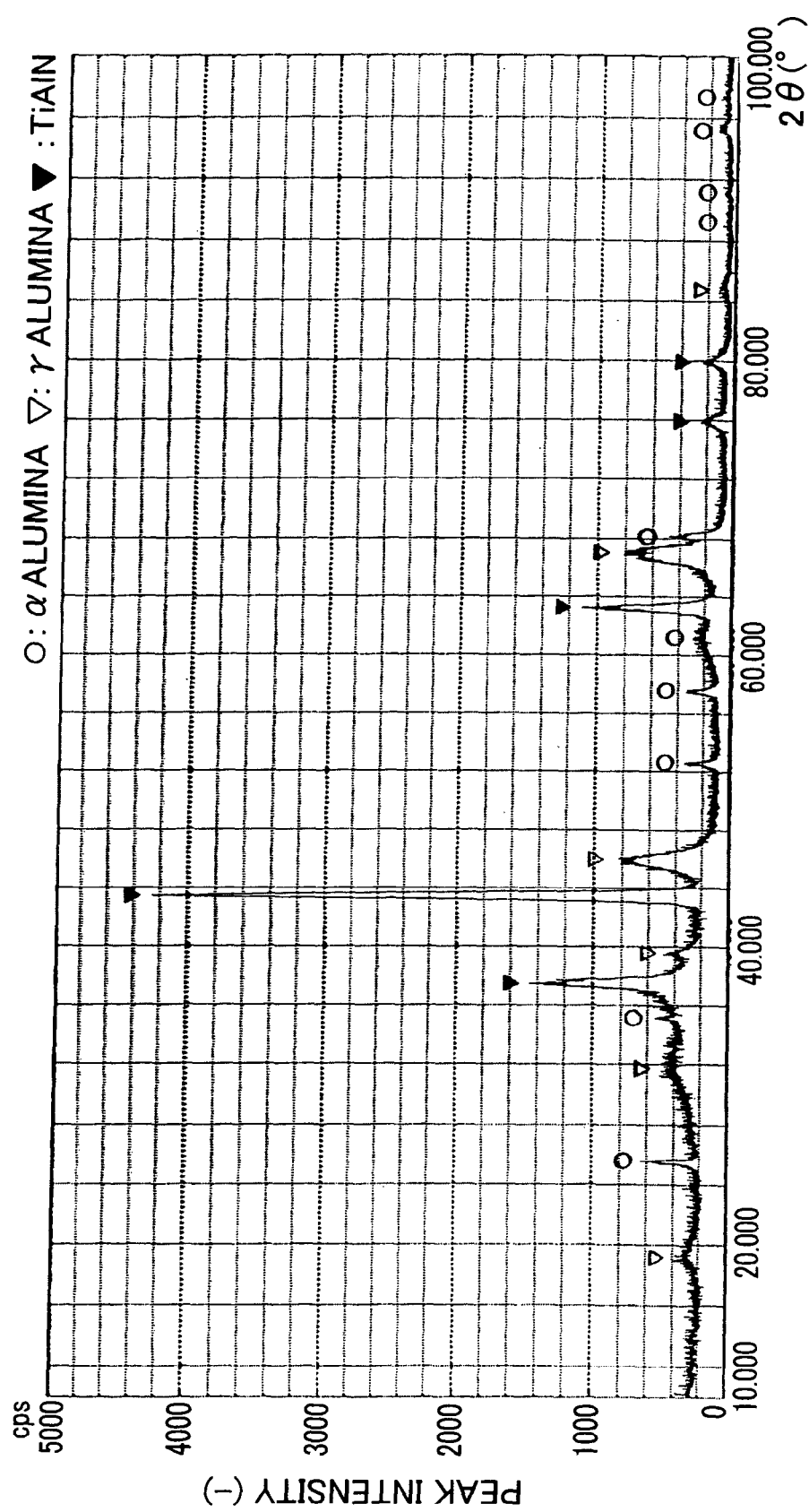
FIG. 16 is a chart showing the thin-film X-ray diffraction pattern of an alumina film formed on a TiAlN film previously polished with diamond powder (film-forming temperature: 700° C.).

As Comparative Examples, the results obtained when the substrate was pretreated under the condition (G) (polishing with diamond powder) are shown in FIG. 16, and the results obtained when the substrate was pretreated under the condition (H) (ultrasonication in ethanolic dispersion of diamond powder) in FIG. 17.

FIGS. 16 and 17, wherein alpha-alumina peaks are smaller, indicate that the alumina film has a mixture of alpha and γ crystal structures, a result almost identical with that when the substrate was not pretreated.

Further, by comparison between FIG. 14 (polishing with alumina powder) and FIG. 16 (polishing with diamond powder) and also between FIG. 15 (ultrasonication by using alumina powder) and FIG. 17 (ultrasonication by using diamond powder), it is obvious that use of the alumina powder according to the present invention is effective as the hard powder for use in pretreatment even when the alumina film is formed on a TiAlN film.

INDUSTRIAL APPLICABILITY

By the present invention, it is possible to form a quasi-alpha-alumina film easily at a relatively low temperature, independently of the kind of the substrate, not only on a substrate having a film such as of TiAlN or CrN formed thereon, but also on a substrate such as Si wafer whereon only alumina in γ crystal structure was formed traditionally at a temperature of approximately 800° C. or lower.

In addition, when a substrate having a film, for example, of TiAlN or CrN formed on the surface thereof is used, it is possible to form a quasi-alpha-alumina film, even at a lower temperature at which a mixture of alumina in γ and alpha crystal structures are easily formed.

The invention claimed is:

1. A method of producing an alumina film mainly in alpha crystal structure on a substrate wherein the substrate optionally has a film previously formed thereon, comprising:
   treating the surface of the substrate with a ceramic powder mainly having a crystal structure which is the same as the crystal structure of alumina in the alpha crystal structure to form fine scratches on the surface of the substrate;
   washing away the ceramic powder to leave the fine scratches on the surface of the substrate; and then
   depositing the alumina film mainly in alpha crystal structure on the substrate.

2. The method of producing the alumina film according to claim 1, wherein the ceramic powder is an alumina powder in alpha crystal structure.

3. The method of producing the alumina film according to claim 2, wherein the alumina powder has an average particle diameter of 50 μm or less.

4. The method of producing the alumina film according to claim 1, wherein the substrate has a film formed on the surface thereof made of one or more compounds selected from the group consisting of compounds of one or more elements selected from the group consisting of elements in Groups 4a, 5a and 6a in the periodic table, Al, Si and Y with one or more elements of C, N, B, and O; the solid solutions thereof; and compounds of one or more elements of C, N, and B.

5. The method of producing the alumina film according to claim 4, wherein the substrate has a hard film formed on the surface thereof comprising one or more compounds selected from the group consisting of TiN, TiC, TiCN, TiAlN and TiAlCrN.

6. The method of producing the alumina film according to claim 1, wherein treating the substrate surface comprises polishing the substrate surface with the ceramic powder.

7. The method of producing the alumina film according to claim 1, wherein treating the substrate surface comprises immersing and ultrasonicating the substrate in a liquid in which the ceramic powder is dispersed.

8. The method of producing the alumina film according to claim 1, wherein depositing the alumina film comprises a gas-phase growth method.

9. The method of producing the alumina film according to claim 8, wherein the gas-phase growth method is a method selected from the group consisting of CVD, PE-CVD, sputtering, ion plating and vapor deposition.

10. A method of producing a laminated film-coated part, comprising depositing an alumina film mainly in alpha crystal structure on the film previously formed on the substrate according to claim 1.

11. A method of producing a laminated film-coated part comprising an alumina film namely in alpha crystal structure, comprising: forming a hard film containing one or more compounds selected from the group consisting of TiN, TiC, TiCN, TiAlN and TiAlCrN on a substrate, treating a surface of the hard film with a ceramic powder mainly having a crystal structure which is the same as the crystal structure of alumina in the alpha crystal structure to form fine scratches on the surface of the hard film, washing away the ceramic powder to leave the fine scratches on the surface of the hard film, and then depositing an alumina film mainly in alpha crystal structure on the hard film after the surface treatment with said ceramic powder.

12. The method of producing the alumina film according to claim 1, comprising depositing the alumina film mainly in alpha crystal structure at a temperature of 650 to 800° C.

13. The method of producing the alumina film according to claim 1, further comprising oxidizing the substrate at a temperature of 650 to 800° C. prior to depositing the alumina film on the substrate.

14. The method of producing the alumina film according to claim 2, wherein the alumina powder has an average particle diameter of 1 µm or less.

15. The method of producing the alumina film according to claim 1, wherein the thickness of the alumina film is in a range of 0.1 µm to 20 µm.

16. The method of producing an alumina film according to claim 1, wherein the thickness of the alumina film is in a range of 1 µm to 5 µm.

17. The method of producing an alumina film mainly in alpha crystal structure on a substrate wherein the substrate optionally has a film previously formed thereon according to claim 1, comprising:
   treating the surface of the substrate with a ceramic powder mainly having a crystal structure which is the same as the crystal structure of alumina in the alpha crystal structure to form fine scratches on the surface of the substrate;
   washing away the ceramic powder to leave the fine scratches on the surface of the substrate; and then
   depositing the alumina film mainly in alpha crystal structure at a temperature of 650 to 800° C. on the substrate by a gas-phase growth method selected from the group consisting of CVD, PE-CVD, sputtering, ion plating and vapor deposition.

18. The method of producing an alumina film mainly in alpha crystal structure on a substrate (including a substrate having a film previously formed thereon) according to claim 1, wherein an oxygen pressure during depositing the alumina film mainly in alpha crystal structure on the substrate, is 0.75 Pa or less.

* * * * *